US010782608B2

(12) United States Patent
Inazuki et al.

(10) Patent No.: US 10,782,608 B2
(45) Date of Patent: Sep. 22, 2020

(54) METHOD FOR PREPARING PHOTOMASK BLANK, PHOTOMASK BLANK, METHOD FOR PREPARING PHOTOMASK, PHOTOMASK, AND METALLIC CHROMIUM TARGET

(71) Applicant: Shin-Etsu Chemical Co., Ltd., Tokyo (JP)

(72) Inventors: Yukio Inazuki, Joetsu (JP); Kouhei Sasamoto, Joetsu (JP); Tsutomu Yuri, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 28 days.

(21) Appl. No.: 15/883,538

(22) Filed: Jan. 30, 2018

(65) Prior Publication Data

US 2018/0224737 A1 Aug. 9, 2018

(30) Foreign Application Priority Data

Feb. 9, 2017 (JP) ................................ 2017-021753
Feb. 17, 2017 (JP) ................................ 2017-027772
May 2, 2017 (JP) ................................ 2017-091847

(51) Int. Cl.

| | |
|---|---|
| ***G03F 1/22*** | (2012.01) |
| ***G03F 1/32*** | (2012.01) |
| ***C01B 33/06*** | (2006.01) |
| ***C01B 21/082*** | (2006.01) |
| ***C22C 27/06*** | (2006.01) |
| ***C23C 14/14*** | (2006.01) |
| ***C23C 14/34*** | (2006.01) |
| ***G03F 1/84*** | (2012.01) |
| ***G03F 1/54*** | (2012.01) |

(52) U.S. Cl.

CPC ............ *G03F 1/32* (2013.01); *C01B 21/0821* (2013.01); *C01B 21/0823* (2013.01); *C01B 33/06* (2013.01); *C22C 27/06* (2013.01); *C23C 14/14* (2013.01); *C23C 14/3414* (2013.01); *G03F 1/54* (2013.01); *G03F 1/84* (2013.01)

(58) Field of Classification Search

CPC ..... G03F 1/22; G03F 1/26; G03F 1/84; G03F 1/54; C23C 14/34

See application file for complete search history.

(56) References Cited

U.S. PATENT DOCUMENTS 5,830,607 A 11/1998 Isao et al.
2013/0309598 A1 * 11/2013 Fukaya .................... G03F 1/29 430/5

FOREIGN PATENT DOCUMENTS

JP 7-140635 A 6/1995
KR 10-2011-0057064 A 5/2011

OTHER PUBLICATIONS

Extended European Search Report dated Jun. 15, 2018, in European Patent Application No. 18154156.6.

* cited by examiner

*Primary Examiner* — Daborah Chacko-Davis
(74) *Attorney, Agent, or Firm* — Birch, Stewart, Kolasch & Birch, LLP

(57) ABSTRACT

A method for preparing a photomask blank comprising a transparent substrate and a chromium-containing film contiguous thereto involves the step of depositing the chromium-containing film by sputtering a metallic chromium target having an Ag content of up to 1 ppm. When a photomask prepared from the photomask blank is repeatedly used in patternwise exposure to ArF excimer laser radiation, the number of defects formed on the photomask is minimized.

18 Claims, 5 Drawing Sheets

METHOD FOR PREPARING PHOTOMASK BLANK, PHOTOMASK BLANK, METHOD FOR PREPARING PHOTOMASK, PHOTOMASK, AND METALLIC CHROMIUM TARGET

CROSS-REFERENCE TO RELATED APPLICATION

This non-provisional application claims priority under 35 U.S.C. § 119(a) on Patent Application Nos. 2017-021753, 2017-027772 and 2017-091847 filed in Japan on Feb. 9, 2017, Feb. 17, 2017 and May 2, 2017, respectively, the entire contents of which are hereby incorporated by reference.

TECHNICAL FIELD

This invention relates to a photomask blank and a photomask for use in the microfabrication of semiconductor integrated circuits or the like, methods for preparing the photomask blank and the photomask, and a metallic chromium target used in the method.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is generally about 4 times the size of pattern features formed on a semiconductor substrate. In the current photolithography technology, the size of circuit patterns printed is significantly smaller than the wavelength of light used for exposure. Therefore, if a photomask pattern is formed simply by multiplying the size of circuit pattern 4 times, the desired pattern is not transferred to a resist film on a semiconductor substrate due to optical interference and other effects during exposure.

Sometimes, the optical interference and other effects during exposure are mitigated by forming the pattern on a photomask to a more complex shape than the actual circuit pattern. Such a complex pattern shape may be designed, for example, by incorporating optical proximity correction (OPC) into the actual circuit pattern. Also, attempts are made to apply the resolution enhancement technology (RET) such as modified illumination, immersion lithography or double exposure (or double patterning) lithography, to meet the demand for miniaturization and higher accuracy of patterns.

The phase shift method is used as one of the RET. The phase shift method is by forming a pattern of a phase shift film on a photomask such that a phase shift between the exposure light transmitted by a transmissive region where the phase shift film is not formed and the exposure light transmitted by a region of the phase shift film (phase shift region) is approximately 180 degrees, wherein contrast is improved by utilizing optical interference. One of the photomasks adapted for the phase shift method is a halftone phase shift mask. Typically, the halftone phase shift mask includes a substrate of quartz or similar material which is transparent to exposure light, and a photomask pattern of halftone phase shift film formed on the substrate, providing a phase shift of approximately 180° and having an insufficient transmittance to contribute to pattern formation, the phase shift occurring between the exposure light transmitted by a transmissive region where the halftone phase shift film is not formed and the exposure light transmitted by a region (phase shift region) where the halftone phase shift film is formed. As the halftone phase shift mask, Patent Document 1 proposes a mask having a halftone phase shift film of molybdenum silicide oxide (MoSiO) or molybdenum silicide oxynitride (MoSiON). Masks having a halftone phase shift film of SiN and SiON are also known.

CITATION LIST

Patent Document 1: JP-A H07-140635

SUMMARY OF INVENTION

Recently proposed is a halftone phase shift mask blank comprising a transparent substrate, a halftone phase shift film composed of a molybdenum/silicon-containing material thereon, and a light-shielding film composed of a chromium-containing material disposed contiguous to the phase shift film. The light-shielding film is partially removed from this halftone phase shift mask blank, yielding a halftone phase shift mask having a halftone phase shift film pattern, which is used in pattern exposure of wafers or the like. As pattern exposure is repeated on the halftone phase shift mask, a problem arises that defects form on the halftone phase shift film. In the future when a higher pattern accuracy will be desired, defect formation by similar causes can be a problem with combinations other than the combination of a halftone phase shift film of molybdenum/silicon-containing material and a light-shielding film of chromium-containing material.

An object of the invention is to provide a method for preparing a photomask blank comprising a silicon-containing film, for example, a halftone phase shift film composed of a molybdenum/silicon-containing material, and a chromium-containing film disposed contiguous to each other, or a photomask blank comprising a transparent substrate and a chromium-containing film, especially a photomask blank comprising a transparent substrate and a chromium-containing film disposed contiguous thereto, which method minimizes formation of defects in the silicon-containing film or transparent substrate contiguous to the chromium-containing film at the stage of a photomask prepared from the photomask blank; and such a photomask blank.

Another object of the invention is to provide a metallic chromium target used in the preparation method, a method for preparing a photomask, and a photomask.

The inventors have found that when pattern exposure is repeated on a photomask having a silicon-containing film, defects form on the silicon-containing film or transparent substrate, which are caused by a specific metal impurity in the silicon-containing film or a chromium-containing film contiguous to the substrate at the stage of a photomask blank; that reducing the specific metal impurity in such film is effective for reducing defects; and especially, that the metal impurity mainly originates from the impurity in a metallic chromium target used in sputter deposition of the chromium-containing film.

Also the inventors have found that the use of a metallic chromium target having a minimized content of the specific metal impurity ensures that an acceptable photomask blank is prepared by sputtering the metallic chromium target to deposit a chromium-containing film contiguous to the silicon-containing film or transparent substrate, and that even when pattern exposure is repeated on a photomask prepared from the photomask blank, the number of defects which form in the silicon-containing film (on which the chromium-containing film has been removed) or transparent substrate is minimized.

Further, the inventors have found that not only for the silicon-containing film or substrate contiguous to the chromium-containing film, but also for any film (other than the silicon-containing film) contiguous to the chromium-containing film, especially for all of the substrate and films included in the photomask blank, defect formation can be suppressed by reducing the content of specific metal impurity in depositing the film contacted with the substrate or the films contacted each other.

In one aspect, the invention provides a method for preparing a photomask blank comprising a transparent substrate and a silicon-containing film and a chromium-containing film disposed contiguous to each other, or a transparent substrate and a chromium-containing film disposed contiguous thereto, the silicon-containing film being composed of a silicon-containing material selected from silicon alone, a silicon compound consisting of silicon and at least one light element selected from oxygen, nitrogen and carbon, and a transition metal silicon compound consisting of at least one transition metal selected from titanium, vanadium, cobalt, nickel, zirconium, niobium, molybdenum, hafnium, tantalum and tungsten, silicon, and at least one light element selected from oxygen, nitrogen and carbon, the chromium-containing film being composed of a chromium-containing material, the method comprising the step of depositing the chromium-containing film by sputtering a metallic chromium target having a silver content of up to 1 ppm.

The method may further comprise the step of selecting a metallic chromium target which has been confirmed by compositional analysis to have a silver content of up to 1 ppm, only the selected metallic chromium target being used in the sputter deposition step.

In a preferred embodiment, the metallic chromium target has a chromium content of at least 99.99% by weight.

In a preferred embodiment, the metallic chromium target contains lead, copper, tin and gold each in a content of up to 1 ppm.

In a preferred embodiment, the photomask blank comprises a transparent substrate and a silicon-containing film and a chromium-containing film disposed contiguous to each other and stacked in order from the substrate side, the silicon-containing film is a halftone phase shift film, and the chromium-containing film is a light-shielding film; or the photomask blank comprises a transparent substrate and a chromium-containing film disposed contiguous thereto, the chromium-containing film is a light-shielding film.

In a preferred embodiment, the photomask blank comprises a transparent substrate and a silicon-containing film and a chromium-containing film disposed contiguous to each other, the silicon-containing film is a halftone phase shift film having a transmittance of 5% to less than 30% with respect to exposure light, and the chromium-containing film is a light-shielding film having an optical density of 1 to less than 3 with respect to exposure light.

In a preferred embodiment, the photomask blank comprises a transparent substrate and a silicon-containing film and a chromium-containing film disposed contiguous to each other, the silicon-containing film is a light-shielding film having an optical density of at least 2.5 with respect to exposure light, and the chromium-containing film has a sheet resistance of up to 15,000 Ω/□.

The method may further comprise the steps of:

assigning a criterion value of judgment of silver content to one or more substrate or films selected from the transparent substrate and the silicon-containing film and the chromium-containing film disposed contiguous to each other, or one or more substrate or films selected from the transparent substrate and the chromium-containing film disposed contiguous thereto, and sorting photomask blanks having a silver content of not more than the criterion value as pass blanks and photomask blanks having a silver content of more than the criterion value as reject blanks.

In a preferred embodiment, the photomask blank further comprises a resist film.

The method may further comprise the steps of:

assigning a criterion value of judgment of silver content to one or more substrate or films selected from the transparent substrate, the silicon-containing film and the chromium-containing film disposed contiguous to each other, and the resist film, or one or more substrate or films selected from the transparent substrate, the chromium-containing film disposed contiguous thereto, and the resist film, and sorting photomask blanks having a silver content of not more than the criterion value as pass blanks and photomask blanks having a silver content of more than the criterion value as reject blanks.

In a preferred embodiment, the criterion value is a silver content as measured by inductively coupled plasma mass spectrometry (ICP-MS) and a content of 1 ppm is applied as the criterion.

In another aspect, the invention provides a photomask blank prepared by the method defined above.

Another embodiment is a photomask blank comprising a transparent substrate and a chromium-containing film, the chromium-containing film having a silver content of up to 1 ppm.

In a preferred embodiment, all the substrate and the film included in the photomask blank have a silver content of up to 1 ppm.

In a further aspect, the invention provides a method for preparing a photomask, comprising the step of using the photomask blank obtained by the method defined above.

In a further aspect, the invention provides a method for preparing a photomask, comprising the step of using the photomask blank which is sorted as pass blank by the method defined above.

In a still further aspect, the invention provides a photomask prepared from the photomask blank defined above.

Also contemplated herein is a metallic chromium target for use in depositing the chromium-containing film in the photomask blank defined herein, the target having a silver content of up to 1 ppm; or a metallic chromium target for use in sputter deposition of a chromium-containing film to construct a photomask blank, the target having a silver content of up to 1 ppm.

As used herein, the term "ppm" refers to parts by weight per million parts by weight (ppmw: parts per million weight).

Advantageous Effects of Invention

When a photomask prepared from the inventive photomask blank is repeatedly used in patternwise exposure to ArF excimer laser radiation or similar radiation, the number of defects formed on the photomask, especially the silicon-containing film or transparent substrate is minimized.

DESCRIPTION OF PREFERRED EMBODIMENTS

One embodiment A of the invention is a photomask blank comprising a transparent substrate and a silicon-containing film and a chromium-containing film disposed contiguous to each other. That is, Embodiment A is a photomask blank comprising a transparent substrate, at least one silicon-containing film, and at least one chromium-containing film, wherein at least one combination of the silicon-containing film and the chromium-containing film disposed contiguous to each other is included. Either the silicon-containing film or the chromium-containing film may be formed on the substrate directly or via an intervening film other than the silicon-containing film and the chromium-containing film.

Another embodiment B of the invention is a photomask blank comprising a transparent substrate and a chromium-containing film disposed contiguous to the substrate. In the photomask blank of Embodiment B, another film may be formed on the chromium-containing film.

The transparent substrate is preferably a quartz substrate, i.e., a substrate of silicon dioxide ($SiO_2$). The size of the substrate is not particularly limited. Where photomasks are intended for use in pattern exposure of wafers, transparent substrates of 6 inch (=152 mm) squares and 0.25 inch (=6.35 mm) thick, known as 6025 substrate, are used.

Figure 1:
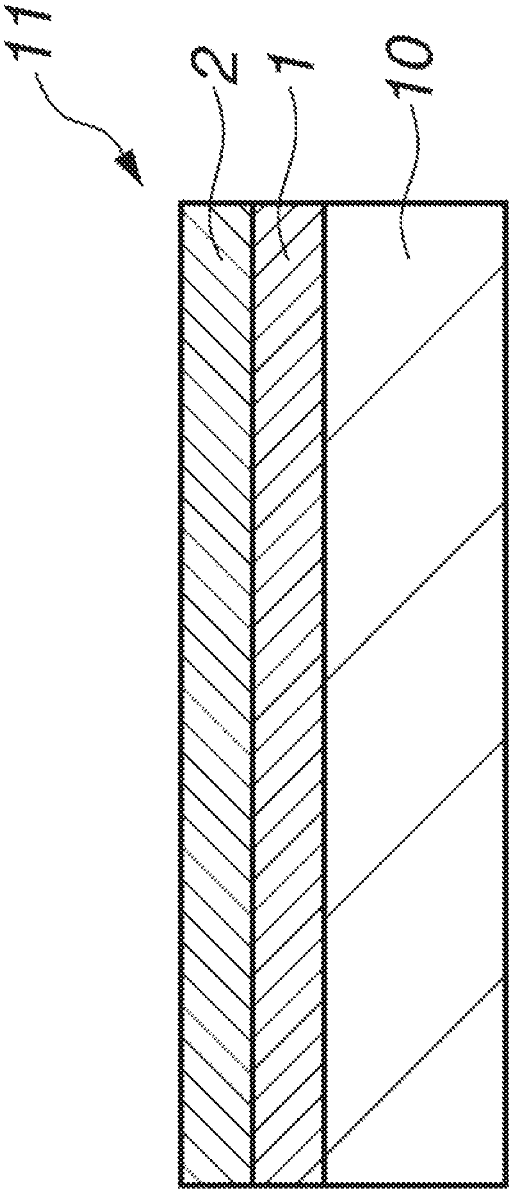
FIG. 1 is a cross-sectional view of a photomask blank in one embodiment (first example of Embodiment A) of the invention.

Embodiment A includes a first example which is illustrated in FIG. 1 as a photomask blank 11 comprising a transparent substrate 10, a silicon-containing film 1 disposed contiguous to the substrate 10, and a chromium-containing film 2 disposed contiguous to the silicon-containing film 1. In this example, the film on the substrate is a multilayer film consisting of two layers.

Figure 2:
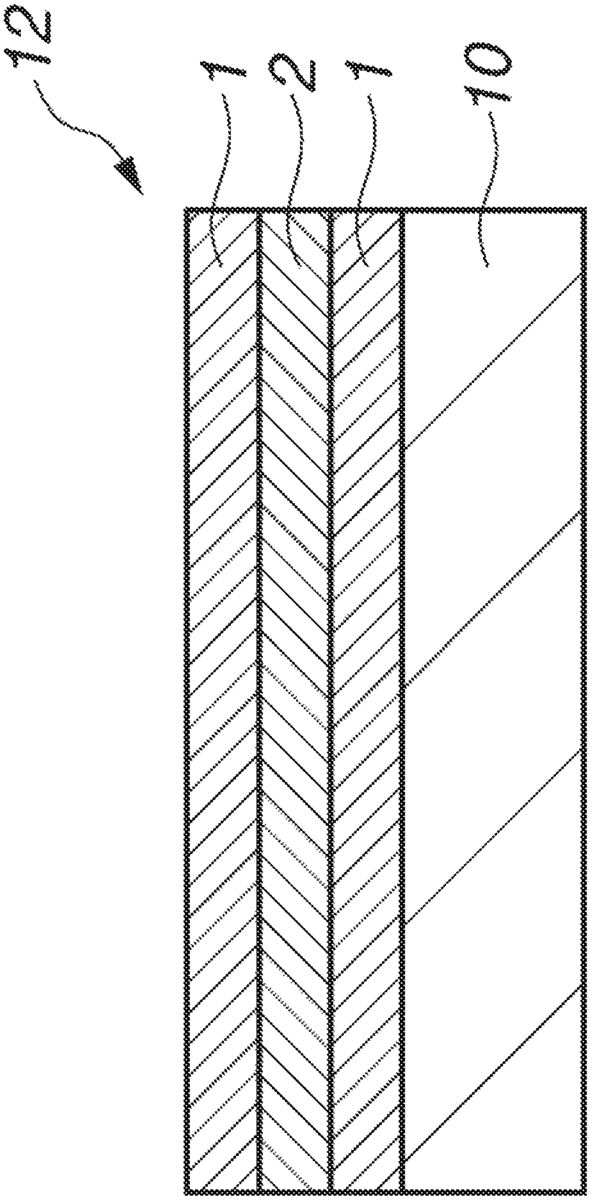
FIG. 2 is a cross-sectional view of a photomask blank in another embodiment (second example of Embodiment A) of the invention.

Another example of Embodiment A is a photomask blank wherein the film on the substrate is a multilayer film consisting of three layers. Namely, Embodiment A includes a second example which is illustrated in FIG. 2 as a photomask blank 12 comprising a transparent substrate 10, a silicon-containing film 1 disposed contiguous to the substrate 10, a chromium-containing film 2 disposed contiguous to the silicon-containing film 1, and another silicon-containing film 1 disposed contiguous to the chromium-containing film 2.

Figure 3:
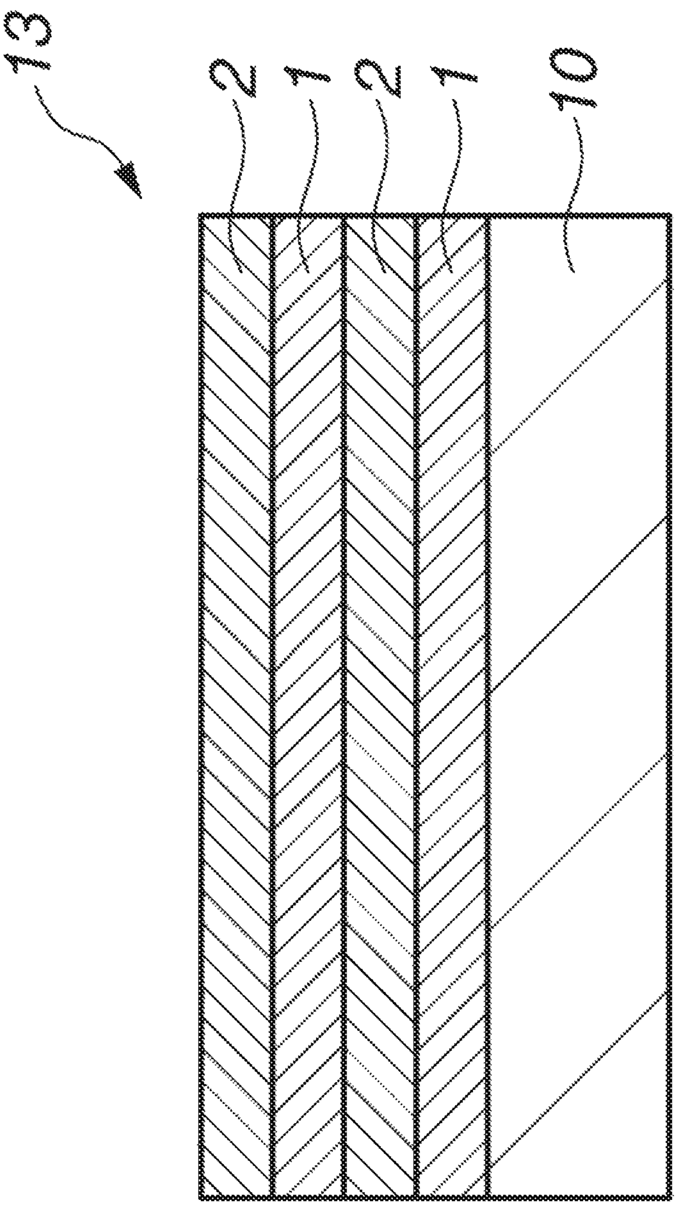
FIG. 3 is a cross-sectional view of a photomask blank in a further embodiment (third example of Embodiment A) of the invention.

A further example of Embodiment A is a photomask blank wherein the film on the substrate is a multilayer film consisting of four layers. Namely, Embodiment A includes a third example which is illustrated in FIG. 3 as a photomask blank 13 comprising a transparent substrate 10, a silicon-containing film 1 disposed contiguous to the substrate 10, a chromium-containing film 2 disposed contiguous to the silicon-containing film 1, another silicon-containing film 1 disposed contiguous to the chromium-containing film 2, and another chromium-containing film 2 disposed contiguous to the other silicon-containing film 1.

Figure 4:
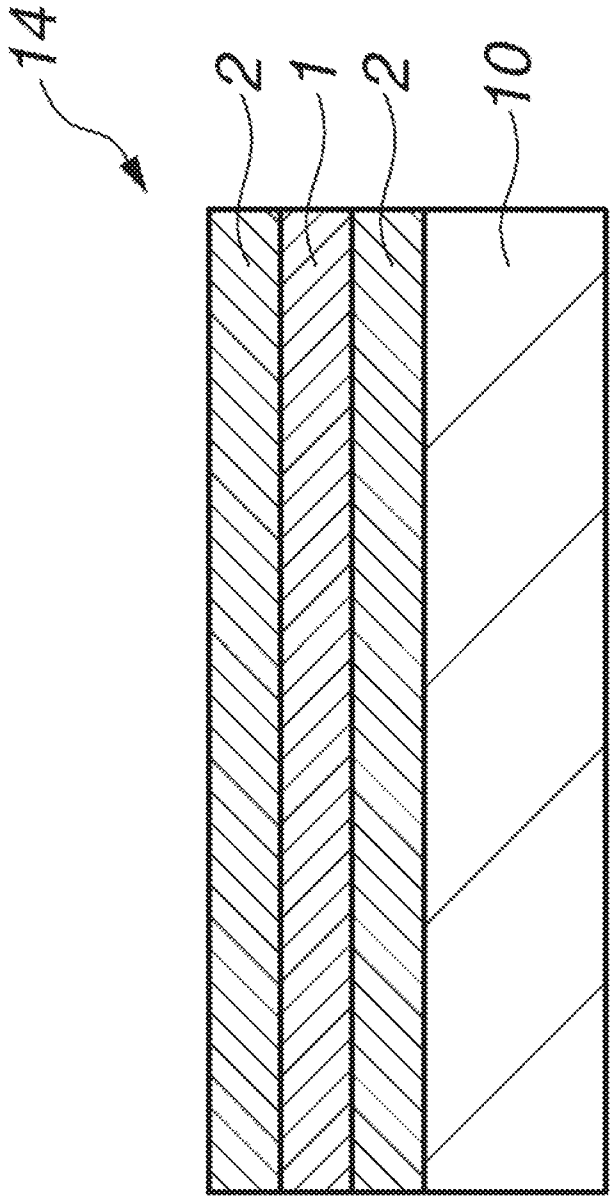
FIG. 4 is a cross-sectional view of a photomask blank in a further embodiment (fourth example of Embodiment A) of the invention.

A further example of Embodiment A is a photomask blank wherein the film on the substrate is a multilayer film consisting of three layers. Namely, Embodiment A includes a fourth example which is illustrated in FIG. 4 as a photomask blank 14 comprising a transparent substrate 10, a chromium-containing film 2 disposed contiguous to the substrate 10, a silicon-containing film 1 disposed contiguous to the chromium-containing film 2, and another chromium-containing film 2 disposed contiguous to the silicon-containing film 1.

Figure 5:
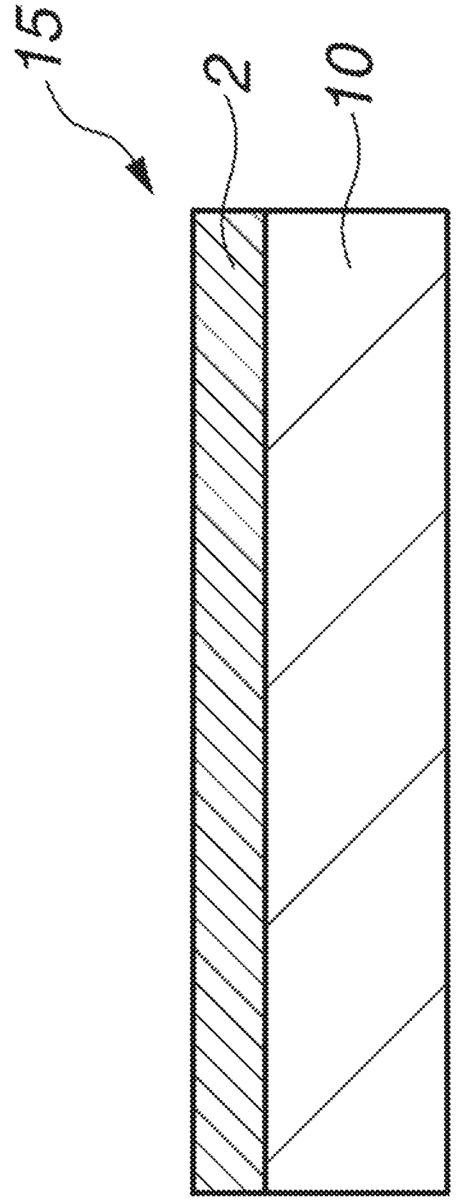
FIG. 5 is a cross-sectional view of a photomask blank in a still further embodiment (Embodiment B) of the invention.

Embodiment B is illustrated in FIG. 5 as a photomask blank 15 comprising a transparent substrate 10 and a chromium-containing film 2 disposed contiguous to the substrate 10.

The silicon-containing film is composed of a silicon-containing material. The silicon-containing material is resistant to chlorine base dry etching and removable by fluorine base dry etching. The chlorine base dry etching is typically oxygen-containing chlorine base dry etching using a mixture of oxygen gas ($O_2$) and chlorine gas ($Cl_2$), optionally containing a rare gas such as argon gas (Ar) or helium gas (He) as the etching gas. The fluorine base dry etching is typically fluorine base dry etching using a mixture of sulfur hexafluoride gas ($SF_6$) or carbon tetrafluoride gas ($CF_4$), oxygen gas ($O_2$), and a rare gas such as argon gas (Ar) or helium gas (He) as the etching gas.

The silicon-containing material is preferably selected from silicon (Si) alone, silicon compounds consisting of silicon (Si) and at least one light element selected from oxygen (O), nitrogen (N), and carbon (C), and transition metal silicon compounds consisting of at least one transition metal (Me) selected from titanium (Ti), vanadium (V), cobalt (Co), nickel (Ni), zirconium (Zr), niobium (Nb), molybdenum (Mo), hafnium (Hf), tantalum (Ta), and tungsten (W), silicon (Si), and at least one light element selected from oxygen (O), nitrogen (N), and carbon (C). Inter alia, silicon compounds and transition metal silicon compounds are preferred.

Examples of the silicon compound include silicon oxide (SiO), silicon nitride (SiN), silicon carbide (SiC), silicon oxynitride (SiON), silicon oxycarbide (SiOC), silicon nitride carbide (SiNC), and silicon oxide nitride carbide (SiONC). Silicon compounds consisting of 30 to 80 at % of silicon and the balance of light element(s) are preferred.

Examples of the transition metal silicon compound include transition metal silicon oxide (MeSiO), transition metal silicon nitride (MeSiN), transition metal silicon carbide (MeSiC), transition metal silicon oxynitride (MeSiON), transition metal silicon oxycarbide (MeSiOC), transition metal silicon nitride carbide (MeSiNC), and transition metal silicon oxide nitride carbide (MeSiONC). Transition metal silicon compounds consisting of 0.1 to 20 at % of transition metal (Me), 25 to 80 at % of silicon, and the balance of light element(s) are preferred. Among the transition metals, molybdenum (Mo) is most preferred.

The chromium-containing film is composed of a chromium-containing material. The chromium-containing material is resistant to fluorine base dry etching, but removable by chlorine base dry etching.

Suitable chromium-containing materials include chromium (Cr) alone, and chromium compounds containing chromium (Cr) and at least one light element selected from oxygen (O), nitrogen (N), and carbon (C). The chromium-containing material should preferably be free of silicon (Si). The preferred chromium-containing materials are chromium compounds, especially chromium compounds consisting of chromium (Cr) and at least one light element selected from oxygen (O), nitrogen (N), and carbon (C). Examples of the chromium compound include chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC). Chromium compounds consisting of 30 to 90 at % of chromium and the balance of light element(s) are preferred.

In the invention, the silicon-containing film and the chromium-containing film are functional films included in photomask blanks and photomasks. Each of the silicon-containing film and chromium-containing film is formed as an optical functional film such as a phase shift film (e.g., halftone phase shift film), light-shielding film or antireflective film, or an auxiliary processing film such as a hard mask film (etching mask film), etching stop film or conductive film. Each of the silicon-containing film and chromium-containing film may be either a monolayer film or a multilayer film (consisting of a plurality of layers). In the case of multilayer film, the light-shielding film, for example, may be a combination of a light-shielding layer and an antireflective layer.

More particularly, when a photomask blank has the silicon-containing film which is a phase shift film such as a halftone phase shift film, it is a phase shift mask blank such as a halftone phase shift mask blank, from which a phase shift mask such as a halftone phase shift mask may be prepared.

The phase shift of the halftone phase shift film with respect to exposure light, that is, the phase shift between the exposure light transmitted by halftone phase shift film and the exposure light transmitted by an air layer of the same thickness as the halftone phase shift film is such that a phase shift between the exposure light transmitted by a region of halftone phase shift film (phase shift region) and the exposure light transmitted by a neighboring region where the halftone phase shift film is removed causes interference of exposure light at the interface between the film region and the film-removed region whereby contrast is increased. Specifically the phase shift is 150 to 200 degrees. Although ordinary phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 1800. The halftone phase shift film should preferably have a transmittance of at least 3%, more preferably at least 5% and up to 30%, more preferably less than 30%, even more preferably up to 20% with respect to exposure light.

Described below is the functional film constituted by the silicon-containing film or chromium-containing film. For example, in the case of a photomask blank of the first example of Embodiment A, preferably the silicon-containing film is a halftone phase shift film or light-shielding film and the chromium-containing film is a light-shielding film or hard mask film. Specifically, a multilayer film in which a silicon-containing film serving as the halftone phase shift film and a chromium-containing film serving as the light-shielding film are deposited in order from the substrate side, and a multilayer film in which a silicon-containing film serving as the light-shielding film and a chromium-containing film serving as the hard mask film are deposited in order from the substrate side are preferred.

In the case of a photomask blank of the second example of Embodiment A, preferably the silicon-containing film is a halftone phase shift film or hard mask film and the chromium-containing film is a light-shielding film. Specifically, a multilayer film in which a silicon-containing film serving as the halftone phase shift film, a chromium-containing film serving as the light-shielding film, and a silicon-containing film as the hard mask film are deposited in order from the substrate side is preferred.

In the case of a photomask blank of the third example of Embodiment A, preferably the silicon-containing film is a halftone phase shift film or light-shielding film and the chromium-containing film is a light-shielding film, etching stop film or hard mask film. Specifically, a multilayer film in which a silicon-containing film serving as the halftone phase shift film, a chromium-containing film serving as the etching stop/hard mask film, a silicon-containing film as the light-shielding film, and a chromium-containing film as the hard mask film are deposited in order from the substrate side is preferred.

In the case of a photomask blank of the fourth example of Embodiment A, preferably the chromium-containing film is an etching stop film or hard mask film and the silicon-containing film is a light-shielding film. Specifically, a multilayer film in which a chromium-containing film serving as the etching stop film, a silicon-containing film as the light-shielding film, and a chromium-containing film as the hard mask film are deposited in order from the substrate side is preferred.

In the case of a photomask blank of Embodiment B, preferably the chromium-containing film is an etching stop film or light-shielding film. Where the chromium-containing film is a light-shielding film, this light-shielding film has an optical density of preferably at least 2.5 and more preferably up to 3, with respect to exposure light.

When the silicon-containing film is a phase shift film such as halftone phase shift film, the chromium-containing film is preferably a light-shielding film, preferably having an optical density of at least 1, more preferably at least 1.5, and less than 3, more preferably up to 2.5, with respect to exposure light. In this case, a silicon-containing film as the phase shift film and a chromium-containing film as the light-shielding film preferably have a total optical density of at least 2.5, more preferably at least 3. On the other hand, when the silicon-containing film is a light-shielding film, this light-shielding film preferably has an optical density of at least 2.5, more preferably at least 3, and up to 5, more preferably up to 4, with respect to exposure light. When the silicon-containing film is a phase shift film such as halftone phase shift film or a light-shielding film, the chromium-containing film is preferably a conductive film in either case, preferably having a sheet resistance of up to 15,000 ohm/squares (Ω/□), more preferably up to 10,000 Ω/□.

The thickness of the silicon-containing film and chromium-containing film is selected as appropriate for a particular function and not particularly limited. In the case of a phase shift film such as halftone phase shift film, the thickness is preferably up to 80 nm, more preferably up to 70 nm, even more preferably up to 65 nm, because a thinner film is easier to form a fine pattern. The lower limit of the film thickness is set in such a range as to provide necessary optical properties with respect to exposure light, for example, radiation of wavelength up to 250 nm, especially up to 200 nm, typically ArF excimer laser (193 nm). The film thickness is generally at least 40 nm, though not limited thereto. In the case of a light-shielding film, its thickness is preferably at least 15 nm, more preferably at least 30 nm and up to 100 nm, more preferably up to 50 nm. In the case of a hard mask film or etching stop film, its thickness is preferably at least 1 nm, more preferably at least 2 nm and up to 20 nm, more preferably up to 15 nm.

The inventive photomask blank may further include a film of organic resist, typically chemically amplified photoresist, especially chemically amplified photoresist for EB lithography, on the functional film constituted by a silicon-containing film or chromium-containing film on a transparent substrate.

Films included in the inventive photomask blank are deposited by sputtering. The sputtering technique may be either DC sputtering or RF sputtering, with any of well-known techniques being employable.

In the step of depositing the chromium-containing film, a metallic chromium target is used as the sputter target. The method involves the step of using a metallic chromium target containing silver (Ag) in a content of up to 1 ppm, preferably up to 0.1 ppm, more preferably up to 0.01 ppm as the sputter target. The method preferably involves the step of selecting a metallic chromium target which has been confirmed by compositional analysis to have a silver content of up to 1 ppm, preferably up to 0.1 ppm, more preferably up to 0.01 ppm. More preferably, only the selected metallic chromium target is used in the sputter deposition step.

If the metallic chromium target contains silver, the chromium-containing film deposited therefrom has a trace of silver introduced therein. Since the chromium-containing film is formed contiguous to the silicon-containing film or substrate, the silver can be left dispersed in the silicon-containing film or transparent substrate, during the deposition or after the chromium-containing film is removed from the silicon-containing film or substrate in contact therewith. Patternwise exposure is repeatedly performed through a photomask having a photomask pattern on the substrate or a photomask having a photomask pattern of silicon-containing film. The repeated irradiation of the photomask with exposure light induces migration of silver whereby silver precipitates on the silicon-containing film or substrate. In order to prevent silver (metal impurity) from precipitation, it is effective to reduce the content of silver in the metallic chromium target to or below a predetermined level. The problem that the silver impurity is left unremoved upon removing of the chromium-containing film and causes defects to the silicon-containing film or substrate can arise not only when the chromium-containing film is contiguous to the silicon-containing film or substrate, but also when the chromium-containing film is formed contiguous to a film other than the silicon-containing film.

In some cases, the defects induced by silver and formed on the photomask may not be judged as defects when the silicon-containing film or transparent substrate is observed immediately after the chromium-containing film is removed during preparation of a photomask. If the sensitivity upon defect observation is improved, then some defects may be detected, but as defects of nano-particulate size. This size is a very small size of the order overlooked at the prior art standard precision (e.g., about several tens nm to about 50 nm). Even defects of nano-particulate size grow detectable as defects of substantial size after the accumulative irradiation of the photomask with exposure light. It is therefore presumed that defects manifest themselves upon accumulative irradiation of exposure light because defects grow to a detectable size as a result of silver migration. There is a possibility of defect formation if an environment which can cause silver migration is encountered other than the irradiation of high-energy radiation.

The formation of defects caused by silver migration has possibility to be suppressed to some extent by effecting intense cleaning, for example, cleaning with concentrated ammonia water after the chromium-containing film is removed. Intense cleaning, however, can cause to form new defects or damage the functional film such as phase shift film or light-shielding film. For this reason, the photomask blank of the invention is advantageous in that it avoids the formation of new defects or damaging of the functional film by intense cleaning.

As to chromium (Cr) which is a base element, on the other hand, the metallic chromium target should preferably have a chromium content (or purity) of at least 99.99% by weight. Since it is believed that the majority of defects formed on the photomask are mainly those caused by metal impurity, a conventionally used content (or purity) that is free of carbon, nitrogen, oxygen, hydrogen and halogen elements is preferably applied as the chromium content (or purity), and specifically, a chromium content (or purity) relative to the total of metals is applied. Thus, components other than the metal may be contained in a content of up to 1,000 ppm. In the case of a metallic chromium target wherein the majority of impurity is a transition metal(s), the content of chromium in the metallic chromium target is substantially a chromium content relative to the total weight of transition metals.

As used herein, the transition metals are naturally occurring transition metal elements. Specifically, the relevant transition metals include, of the elements from Group 3 to Group 11 in the Periodic Table, those elements from scandium (Sc) of atomic number 21 to copper (Cu) of atomic number 29, from yttrium (Y) of atomic number 39 to silver (Ag) of atomic number 47, from lanthanum (La) of atomic number 57 to lutetium (Lu) of atomic number 71 among lanthanides, from hafnium (Hf) of atomic number 72 to gold (Au) of atomic number 79, and from actinium (Ac) of atomic number 89 to uranium (U) of atomic number 92 among actinides. It is noted that since technetium (Tc), promethium (Pm), actinium (Ac) and protactinium (Pa) are elements naturally occurring in extreme traces, their contents may be regarded substantially zero (i.e., below the detection limit), that is, they may be excluded from the relevant elements.

The metallic chromium target may be prepared by any standard methods. For example, an ingot or plate form of chromium is prepared by a melt casting method of melting chromium and casting the melt into a mold to form an ingot, a powder sintering method of sintering a chromium powder by a hot press or HIP under high temperature/pressure conditions, or a hot rolling method of feeding a chromium powder into a container and hot rolling. Thereafter, the ingot or plate form of chromium is worked into a desired shape of target. In the preferred procedure, a raw material for the target is analyzed for impurity contents to confirm that the content of the relevant impurity is not more than the predetermined value, and a target is then prepared using the raw material having an impurity content of not more than the predetermined value.

The contents of metal impurities in a metallic chromium target may be analyzed by glow discharge mass analysis or the like. In the case of niobium (Nb), however, its analysis by glow discharge mass analysis is sometimes impossible because of interference of discharge gas components and molecular ions originating from chromium, the matrix element, and if so, the Nb content may be analyzed by inductively coupled plasma mass spectrometry (ICP-MS).

Among metal impurities in the metallic chromium target, the contents of lead (Pb), copper (Cu), tin (Sn) and gold (Au) are preferably up to 1 ppm, more preferably up to 0.1 ppm, even more preferably up to 0.01 ppm. Lead (Pb) and tin (Sn) are metal impurities in the metallic chromium target although they are not transition metals. These four species of metals are susceptible to migration (as mentioned above) and precipitate on the silicon-containing film. For preventing these metal impurities from precipitation, it is more effective to reduce the contents of these metals in the metallic chromium target at or below the predetermined level.

Also, since iron (Fe) is a metal contained in the raw material for metallic chromium, the metallic chromium target contains a certain content of iron. Although iron is not the metal impurity that positively induces migration as mentioned above, it is recommended that the iron content be so low as not to affect the optical and physical properties of a chromium-containing film to be deposited on a transparent substrate. Therefore, the iron content of the metallic chromium target is preferably up to 30 ppm, more preferably up to 20 ppm.

On the other hand, the sputtering target used in depositing the silicon-containing film may be selected from a silicon target, a silicon nitride target, a target containing silicon and silicon nitride, a target containing silicon and a transition metal, and a composite target of silicon and a transition metal. Optionally, a transition metal target may be used along with a silicon-containing target.

The electric power applied to the target may be selected as appropriate depending on the target size, cooling efficiency, and ease of control of sputter deposition. Typically the power per sputtering surface area of a sputtering target is 0.1 to 10 $W/cm^2$.

When a film of a material containing oxygen, nitrogen and/or carbon is deposited, the preferred sputtering is reactive sputtering. An inert gas and a reactive gas are used as the sputtering gas. Specifically an inert gas (rare gas) selected from helium gas (He), neon gas (Ne), and argon gas (Ar) is combined with a reactive gas selected from oxygen-containing gas, nitrogen-containing gas and carbon-containing gas, e.g., oxygen gas ($O_2$ gas), nitrogen oxide gas ($N_2O$ or $NO_2$ gas), nitrogen gas ($N_2$ gas), carbon oxide gas (CO or $CO_2$ gas) in a proportion adjusted such that a film of the desired composition may be deposited. Where a film is composed of a plurality of layers, for example, where a compositionally graded film whose composition changes stepwise or continuously in thickness direction is formed, one exemplary method for depositing such a film is by depositing a film while changing the composition of sputtering gas stepwise or continuously.

The pressure during sputter deposition may be selected as appropriate in consideration of the stress, chemical resistance and cleaning resistance of a film. The pressure is typically at least 0.01 Pa, preferably at least 0.03 Pa and up to 1 Pa, preferably up to 0.3 Pa, because chemical resistance is improved in the range. The flow rates of gases are selected such that a film of the desired composition may be deposited. Typically the flow rate is 0.1 to 100 sccm. Where the reactive gas and the inert gas are used, the flow rates of reactive gas and inert gas are adjusted such that a flow rate ratio of reactive gas to inert gas may be up to 5.0/1.

There is substantially no difference between the silver content in the metallic chromium target used in the sputter deposition and the silver content in a chromium-containing film resulting therefrom. When a photomask blank comprising a chromium-containing film is constructed, the chromium-containing film has a silver content of preferably up to 1 ppm, more preferably up to 0.1 ppm, even more preferably up to 0.01 ppm. A photomask blank from which a photomask with minimal defects is prepared may be obtained by setting the silver content in a chromium-containing film at or below the predetermined criterion value, and judging whether a photomask blank is pass or reject using the criterion value as the criterion of judgment. Based on the result, a photomask blank in which the formation of defects by migration of silver is suppressed may be sorted. When the method for producing photomask blanks includes the step of sorting photomask blanks as a result of judging whether photomask blanks are pass or reject, all photomask blanks in a lot may be judged by taking some photomask blanks, for example, one or more photomask blanks out of the same lot, and measuring their silver content.

Preferably, not only the silver content of the chromium-containing film, but also the silver content of a transparent substrate and another film (e.g., functional film such as light-shielding film or phase shift film) are set not more than the criterion value, specifically up to 1 ppm, more specifically up to 0.1 ppm, even more specifically up to 0.01 ppm. It is most preferred that for all the transparent substrate and films in the photomask blank, their silver contents be up to 1 ppm. For example, for one or more substrate or films selected from the transparent substrate and the silicon-containing film and chromium-containing film disposed contiguous to each other, or for one or more substrate or films selected from the transparent substrate and the chromium-containing film disposed contiguous thereto, or in the case of a photomask blank further comprising a resist film, for one or more substrate or films selected from the transparent substrate, the silicon-containing film and chromium-containing film disposed contiguous to each other, and the resist film, or for one or more substrate or films selected from the transparent substrate, the chromium-containing film disposed contiguous thereto, and the resist film, preferably the silver content(s) is set not more than the criterion value, specifically up to 1 ppm, more specifically up to 0.1 ppm, even more specifically up to 0.01 ppm.

A satisfactory photomask blank may be obtained, for example, by assigning a criterion value for the judgment of silver content of a substrate or film, and sorting photomask blanks having a silver content of not more than the criterion value as pass blanks and photomask blanks having a silver content of more than the criterion value as reject blanks. Photomask blanks may be prepared by the method involving the judgment and sorting steps. The criterion value for judgment may be, for example, a silver content as measured by inductively coupled plasma mass spectrometry (ICP-MS), and preferably a value of 1 ppm, specifically 0.1 ppm, more specifically 0.01 ppm may be applied as the criterion. Those photomask blanks sorted as pass blanks are used in photomask preparation as the photomask blank from which a satisfactory photomask is prepared.

As to the analysis of a metal content in the substrate or film of a photomask blank, direct analysis is possible when a film at the outermost surface (film remotest from the substrate) is to be analyzed. When an inner film and a portion of the substrate in contact with a film are to be analyzed, analysis may be performed optionally after the overlying film is removed off. When a photomask blank has a silver content of not more than the criterion value, it is judged to be a photomask blank which is unlikely to form unwanted defects even upon long-term exposure.

From the inventive photomask blank, a photomask may be prepared. In preparing a photomask from a photomask blank, any well-known methods may be applied. For example, a film of organic resist, specifically chemically amplified photoresist, more specifically EB lithography chemically amplified photoresist is applied, and a resist pattern is formed from the resist film. Films on the transparent substrate may be patterned in sequence by selecting chlorine base dry etching or fluorine base dry etching depending on etching properties of a film to be etched, and etching the film using the resist pattern or a mask pattern formed from a film included in the photomask blank during the preparation of the photomask as etching mask.

While a photolithographic method for forming a pattern with a half pitch of up to 50 nm, specifically up to 30 nm, more specifically up to 20 nm, and even more specifically up to 10 nm in a processable substrate, involves the steps of forming a photoresist film on the processable substrate and exposing the photoresist film to radiation of wavelength 250 nm or less, especially 200 nm or less, such as ArF excimer laser (193 nm) or $F_2$ laser (157 nm), through a patterned mask for transferring the pattern to the photoresist film, the photomask of the invention is best suited for use in the exposure step. Since the inventive method is capable of minimizing defects of fine size, it is quite effective in a multiple exposure process wherein the accuracy of positioning is more important, such as double patterning or triple patterning process.

The photomask obtained from the photomask blank is advantageously applicable to the pattern forming process comprising projecting exposure light to the pattern of photomask film for transferring the photomask pattern to the photoresist film (object) on the processable substrate. The irradiation of exposure light may be either dry exposure or immersion exposure. The photomask of the invention is effective in the immersion lithography with the tendency that a cumulative irradiation energy dose increases within a relatively short time in commercial scale microfabrication, particularly when a wafer of at least 300 mm as the processable substrate is exposed to a photomask pattern of light by the immersion lithography.

EXAMPLE

Examples are given below for further illustrating the invention although the invention is not limited thereto.

Example 1

In a DC sputtering system, a 6025 quartz substrate was placed, a molybdenum silicide target was used as the target, and argon, oxygen and nitrogen gases were fed as the sputtering gas. By sputtering, a MoSiON film (Mo:Si:O:N=9:37:10:44 in atomic ratio) of 75 nm thick was deposited on the substrate, which film was a halftone phase shift film having a phase shift of 177° and a transmittance of 6% with respect to ArF excimer laser radiation. By sputtering a metallic chromium target and feeding argon, oxygen and nitrogen gases as the sputtering gas in the DC sputtering system, a CrON film (Cr:O:N=40:50:10 in atomic ratio) of 44 nm thick serving as a light-shielding film relative to ArF excimer laser radiation was deposited on the MoSiON film to construct a halftone phase shift mask blank.

The contents of metal impurities in the metallic chromium target used were analyzed by a glow discharge mass spectrometer Element GD Plus GD-MS (Thermo Fisher Scientific Inc.). The contents of metal impurities are shown in Table 1. As for Nb, the detection limit of Nb by glow discharge mass analysis became higher than those of other elements because of interference of discharge gas components and molecular ions originating from chromium, the matrix element. As for Tc, Pm, Ac and Pa, no analysis was made on them because they are elements naturally occurring in extreme traces, and their contents are regarded below the detection limit (1 ppb by weight). The contents of other metal impurities are as shown in Table 1, demonstrating that the chromium content is at least 99.995% by weight based on the total weight of transition metals. The content of Ag in the CrON film in the halftone phase shift mask blank was analyzed by inductively coupled plasma mass spectrometer ICP-MS 7500cs (Agilent Technologies), finding an Ag content of less than 1 ppm.

Next, five halftone phase shift mask blanks were prepared by the same procedure as above. The CrON film was removed from each blank by chlorine base dry etching using an etching gas containing chlorine and oxygen. The bare surface of the MoSiON film was inspected by a defect inspection system M8350 (Lasertec Corp.) using polystyrene latex (PSL) particles as standard particles, detecting at maximum 80 defects sized at least 0.05 μm on the basis of PSL particle size standard. These defects were analyzed for Ag containment by scanning electron microscope/energy dispersive X-ray spectroscopy (SEM/EDX). Cr, O and N were detected, but not Ag, indicating that defects were caused by residues of the CrON film.

Further, one halftone phase shift mask blank was prepared by the same procedure as above. The CrON film was removed from the blank by chlorine base dry etching with an etching gas containing chlorine and oxygen. To the bare MoSiON film, ArF excimer laser radiation was repeatedly irradiated until an accumulative dose of 40 $kJ/cm^2$ was reached. The MoSiON film before and after the laser irradiation was inspected by defect inspection system M8350 (Lasertec Corp.) using PSL particles as standard particles. Over an area range of 5 mm×5 mm=25 $mm^2$ on the MoSiON film under inspection, new defects sized at least 0.05 μm on the basis of PSL particle size standard were not detected on the MoSiON film after the laser irradiation.

Comparative Example 1

In a DC sputtering system, a 6025 quartz substrate was placed, a molybdenum silicide target was used as the target, and argon, oxygen and nitrogen gases were fed as the sputtering gas. By sputtering, a MoSiON film (Mo:Si:O:N=9:37:10:44 in atomic ratio) of 75 nm thick was deposited on the substrate, which film was a halftone phase shift film having a phase shift of 177° and a transmittance of 6% with respect to ArF excimer laser radiation. By sputtering a metallic chromium target and feeding argon, oxygen and nitrogen gases as the sputtering gas in the DC sputtering system, a CrON film (Cr:O:N=40:50:10 in atomic ratio) of 44 nm thick serving as a light-shielding film relative to ArF excimer laser radiation was deposited on the MoSiON film to construct a halftone phase shift mask blank.

The contents of metal impurities in the metallic chromium target used were analyzed by glow discharge mass spectrometer Element GD Plus GD-MS (Thermo Fisher Scientific Inc.). The contents of metal impurities are shown in Table 1. As for Nb, the detection limit of Nb by glow discharge mass analysis became higher than those of other elements because of interference of discharge gas components and molecular ions originating from chromium, the matrix element. As for Tc, Pm, Ac and Pa, no analysis was made on them because they are elements naturally occurring in extreme traces, and their contents are regarded below the detection limit (1 ppb by weight). The contents of other metal impurities are as shown in Table 1, demonstrating that the chromium content is at least 99.995% by weight based on the total weight of transition metals. The content of Ag in the CrON film in the halftone phase shift mask blank was analyzed by spectrometer ICP-MS 7500cs (Agilent Technologies), finding an Ag content of 6 ppm.

Next, five halftone phase shift mask blanks were prepared by the same procedure as above. The CrON film was removed from each blank by chlorine base dry etching using an etching gas containing chlorine and oxygen. The bare surface of the MoSiON film was inspected by defect inspection system M8350 (Lasertec Corp.) using PSL particles as standard particles, and the number of defects sized at least 0.05 μm on the basis of PSL particle size standard was counted. For two blanks, a similar number of defects to Example were detected, and for three blanks, more than 100,000 defects were detected, with the inspection system becoming the overflow state. These defects were analyzed for Ag containment by SEM/EDX. All five blanks contained many defects of about 50 nm size in which Ag was detected, in addition to defects in which Cr, O and N were detected, but not Ag, as found in Example 1.

Further, one halftone phase shift mask blank was prepared by the same procedure as above. The CrON film was removed from the blank by chlorine base dry etching with an etching gas containing chlorine and oxygen. To the bare MoSiON film, ArF excimer laser radiation was repeatedly irradiated until an accumulative dose of 40 kJ/cm$^2$ was reached. The MoSiON film before and after the laser irradiation was inspected by system M8350 (Lasertec Corp.) using PSL particles as standard particles. Over an area range of 5 mm×5 mm=25 mm$^2$ on the MoSiON film under inspection, six new defects sized at least 0.05 μm on the basis of PSL particle size standard were detected on the MoSiON film after the laser irradiation. On analysis of the MoSiON film for Ag containment by SEM/EDX, Ag was detected in the newly detected defects.

TABLE 1

| Metal | Content (ppm) Example 1 | Comparative Example 1 |
|---|---|---|
| Sc | <0.001 | <0.001 |
| Ti | 0.52 | 2 |
| V | 0.34 | 0.42 |
| Cr | Matrix | Matrix |
| Mn | 0.23 | 0.033 |
| Fe | 16 | 2.3 |
| Co | 0.055 | 0.03 |
| Ni | 0.93 | 1.6 |
| Cu | 0.41 | 0.26 |
| Y | <0.1 | <0.1 |
| Zr | <0.5 | <0.2 |

TABLE 1-continued

| Metal | Content (ppm) Example 1 | Comparative Example 1 |
|---|---|---|
| Nb | <50 | <50 |
| Mo | 0.36 | 0.18 |
| Ru | <0.001 | <0.001 |
| Rh | <0.005 | <0.005 |
| Pd | <0.001 | <0.001 |
| Ag | 0.007 | 13 |
| Sn | 0.36 | 0.19 |
| La | 0.15 | <0.001 |
| Ce | <0.001 | <0.001 |
| Pr | <0.001 | <0.001 |
| Nd | <0.001 | <0.001 |
| Sm | <0.001 | <0.001 |
| Eu | <0.001 | <0.001 |
| Gd | <0.001 | <0.001 |
| Tb | <0.001 | <0.001 |
| Dy | <0.001 | <0.001 |
| Ho | <0.001 | <0.001 |
| Er | <0.001 | <0.001 |
| Tm | <0.001 | <0.001 |
| Yb | <0.001 | <0.001 |
| Lu | <0.001 | <0.001 |
| Hf | <0.001 | <0.001 |
| Ta | <0.1 | <0.05 |
| W | 0.073 | 0.079 |
| Re | <0.005 | <0.005 |
| Os | <0.001 | <0.001 |
| Ir | <0.001 | <0.001 |
| Pt | <0.001 | <0.001 |
| Au | <0.001 | <0.001 |
| Pb | 0.13 | 0.66 |
| Th | <0.001 | <0.001 |
| U | <0.001 | <0.001 |

Japanese Patent Application Nos. 2017-021753, 2017-027772 and 2017-091847 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A method for preparing a photomask blank comprising a transparent substrate and a silicon-containing film and a chromium-containing film disposed contiguous to each other, or a transparent substrate and a chromium-containing film disposed contiguous thereto, the silicon-containing film being composed of i) a silicon-containing material consisting of silicon, ii) a silicon compound comprising silicon and at least one element selected from the group consisting of oxygen, nitrogen and carbon, or iii) a transition metal-silicon compound comprising silicon, at least one transition metal selected from the group consisting of titanium, vanadium, cobalt, nickel, zirconium, niobium, molybdenum, hafnium, tantalum and tungsten, and at least one element selected from the group consisting of oxygen, nitrogen and carbon, and the chromium-containing film being composed of a chromium-containing material, the method comprising the steps of:

selecting a metallic chromium target which has been confirmed by compositional analysis to have a silver content and a tin content of up to 1 ppm; and sputtering a target consisting of the selected metallic chromium target to deposit the chromium-containing film on the transparent substrate.

2. The method of claim 1 wherein the metallic chromium target has a chromium content of at least 99.99% by weight.

3. The method of claim 1 wherein the metallic chromium target contains lead, copper, and gold each in a content of up to 1 ppm.

4. The method of claim 1 wherein the photomask blank comprises a transparent substrate and a silicon-containing film and a chromium-containing film disposed contiguous to each other and stacked in order from the substrate side, the silicon-containing film is a halftone phase shift film, and the chromium-containing film is a light-shielding film, or the photomask blank comprises a transparent substrate and a chromium-containing film disposed contiguous thereto, the chromium-containing film is a light-shielding film.

5. The method of claim 1 wherein the photomask blank comprises a transparent substrate and a silicon-containing film and a chromium-containing film disposed contiguous to each other, the silicon-containing film is a halftone phase shift film having a transmittance of 5% to less than 30% with respect to exposure light, and the chromium-containing film is a light-shielding film having an optical density of 1 to less than 3 with respect to exposure light.

6. The method of claim 1 wherein the photomask blank comprises a transparent substrate and a silicon-containing film and a chromium-containing film disposed contiguous to each other, the silicon-containing film is a light-shielding film having an optical density of at least 2.5 with respect to exposure light, and the chromium-containing film has a sheet resistance of up to 15,000 Ω/□.

7. The method of claim 1, further comprising the steps of:

assigning a criterion value of judgment of silver content to one or more substrate or films selected from the transparent substrate and the silicon-containing film and the chromium-containing film disposed contiguous to each other, or one or more substrate or films selected from the transparent substrate and the chromium-containing film disposed contiguous thereto, and sorting photomask blanks having a silver content of not more than the criterion value as pass blanks and photomask blanks having a silver content of more than the criterion value as reject blanks.

8. The method of claim 7 wherein the criterion value is a silver content as measured by inductively coupled plasma mass spectrometry (ICP-MS) and a content of 1 ppm is applied as the criterion.

9. A method for preparing a photomask, comprising the step of using the photomask blank which is sorted as pass blank by the method of claim 7.

10. The method of claim 1 wherein the photomask blank further comprises a resist film.

11. The method of claim 10, further comprising the steps of:

assigning a criterion value of judgment of silver content to one or more substrate or films selected from the transparent substrate, the silicon-containing film and the chromium-containing film disposed contiguous to each other, and the resist film, or one or more substrate or films selected from the transparent substrate, the chromium-containing film disposed contiguous thereto, and the resist film, and sorting photomask blanks having a silver content of not more than the criterion value as pass blanks and photomask blanks having a silver content of more than the criterion value as reject blanks.

12. A photomask blank prepared by the method of claim 1.

13. The photomask blank of claim 12, wherein the chromium-containing film having a silver content and a tin content of up to 1 ppm.

14. The photomask blank of claim 13 wherein all the substrate and the film included in the photomask blank have the silver content and the tin content of up to 1 ppm.

15. A photomask prepared from the photomask blank of claim 12.

16. A method for preparing a photomask, comprising the step of using the photomask blank obtained by the method of claim 1.

17. A metallic chromium target for use in depositing the chromium-containing film in the photomask blank of claim 1, the target having the silver content and the tin content of up to 1 ppm.

18. A photomask blank comprising a transparent substrate and a chromium-containing film, the chromium-containing film having a silver content and a tin content of more than 0 ppm and up to 1 ppm.

* * * * *